United States Patent
Hirota (10) Patent No.: US 7,193,212 B2
(45) Date of Patent: Mar. 20, 2007

(54) INFRARED RADIATION DETECTING DEVICE

(75) Inventor: Masaki Hirota, Zushi (JP)

(73) Assignee: Nissan Motor Co., Ltd., Yokohama (JP)

( * ) Notice: Subject to any disclaimer, the term of this patent is extended or adjusted under 35 U.S.C. 154(b) by 141 days.

(21) Appl. No.: 11/149,183

(22) Filed: Jun. 10, 2005

(65) Prior Publication Data

US 2006/0006333 A1 Jan. 12, 2006

(30) Foreign Application Priority Data

Jul. 9, 2004 (JP) ............................. 2004-202787
Aug. 2, 2004 (JP) ............................. 2004-225101

(51) Int. Cl.
*G01J 5/00* (2006.01)
*H01L 25/00* (2006.01)
(52) U.S. Cl. .................................. 250/338.1; 250/332
(58) Field of Classification Search ............. 250/338.1, 250/332
See application file for complete search history.

(56) References Cited

U.S. PATENT DOCUMENTS 6,332,322 B1 * 12/2001 Tanaka ........................ 62/3.7

FOREIGN PATENT DOCUMENTS

JP 2000065638 A * 3/2000
JP 2000-111396 A 4/2000

* cited by examiner

*Primary Examiner*—Constantine Hannaher
*Assistant Examiner*—Mindy Vu
(74) *Attorney, Agent, or Firm*—Global IP Counselors (57) ABSTRACT

An infrared radiation detecting device is provided that comprises a substrate, an infrared radiation absorbing unit, at least one support beam and a thermopile. The at least one support beam has a first end portion coupled to the substrate and a second end portion coupled to the infrared radiation absorbing unit. The thermopile includes first and second electrical conductors disposed on the support beam with the first and second electrical conductors having different electric conductivities. The first and second electrical conductors is dimensioned and shaped to improve structural rigidity of the support beam in comparison to an identically shaped support beam including a thermopile with a pair of first and second electrical conductors that are identically shaped and disposed parallel to each other.

19 Claims, 12 Drawing Sheets

INFRARED RADIATION DETECTING DEVICE

CROSS-REFERENCE TO RELATED APPLICATIONS

This application claims priority to Japanese Patent Application Nos. 2004-202787 and 2004-225101. The entire disclosures of Japanese Patent Application Nos. 2004-202787 and 2004-225101 are hereby incorporated herein by reference.

BACKGROUND OF THE INVENTION

1. Field of the Invention

The present invention relates to an infrared radiation detecting device for detecting infrared radiation. More specifically, the present invention relates to a thermopile-type infrared radiation detecting device having an infrared radiation absorbing unit on an upper surface of a central portion of a substrate and a thermopile formed on support beams.

2. Background Information

A conventional thermopile-type infrared radiation detecting device having an infrared radiation absorbing unit on an upper surface of a central portion of a substrate and a thermopile formed on a support beam is described in Japanese Laid-Open Patent Publication No. 2000-111396. The infrared radiation absorbing unit is supported over the substrate with a support beam that has been bent into an L shape to obtain a structure in which the infrared radiation absorbing unit and the substrate are thermally isolated from each other. The infrared radiation absorbing unit is configured and arranged to absorb infrared radiation and convert the infrared radiation into heat. An electromotive force or other output quantity resulting from the temperature difference between the light receiving unit (infrared radiation absorbing unit) and the substrate is extracted as a detection value by the thermopile.

In order to improve the sensitivity and the thermal insulation simultaneously, the thermopile of such infrared radiation detecting device is often made of p-type polycrystalline silicon and n-type polycrystalline silicon (hereinafter, polycrystalline silicon is referred as "polysilicon" or "poly-Si"). More specifically, in general, the number of thermocouples forming the thermopile is increased for the purpose of increasing the sensitivity of the infrared radiation detecting device and a plurality of conductors made of polysilicon, as mentioned above, or other material are often provided on a single support beam. For example, in the conventional infrared radiation detecting device described in the above mentioned publication, a thermopile including one pair of electrical conductors (i.e., the conductors made of p-type polycrystalline silicon and n-type polycrystalline silicon) is provided on the single support beam. In the conventional infrared radiation detecting device, the two electrical conductors are disposed parallel to each other.

In view of the above, it will be apparent to those skilled in the art from this disclosure that there exists a need for an improved infrared radiation detecting device. This invention addresses this need in the art as well as other needs, which will become apparent to those skilled in the art from this disclosure.

SUMMARY OF THE INVENTION

It has been discovered that in the conventional infrared radiation detecting device, a bending stress and a torsional stress develop simultaneously in the support beam when the infrared radiation absorbing unit undergoes acceleration in a direction perpendicular to the surface thereof.

In the conventional infrared radiation detecting device described in the above mentioned reference, the sensitivity of the infrared radiation detecting device can be increased by increasing the thermal resistance value of the support beam. This can be accomplished by increasing the length of the support beam and reducing the cross sectional area of the support beam. However, when the height of the support beam is decreased to increase the length of the support beam and to reduce the cross sectional area of the support beam, the resonance frequency of the thermal isolation structure as a whole is reduced because the thickness and, thus, the torsional rigidity of the support beam decreases. As a result, the structural stability or mechanical strength of the infrared radiation detecting device is insufficient. Accordingly, there is the possibility that the infrared radiation detecting device will break.

Moreover, in conventional infrared radiation detecting device described in the above mentioned reference, the p-type polysilicon film and the n-type polysilicon film forming the thermopile both have the same cross sectional area. Since the p-type polysilicon film has a small electric conductivity and a high electric resistance, the amount of thermal noise increases when the cross sectional area thereof is the same as the cross sectional area of the n-type polysilicon film.

Accordingly, one object of the present invention is to increase the structural stability or mechanical strength of the infrared radiation detecting device.

Another object of the present invention is to reduce the thermal noise in the infrared radiation detecting device.

In order to achieve the above mentioned object and other objects of the present invention, an infrared radiation detecting device is provided that comprises a substrate, an infrared radiation absorbing unit, at least one support beam and a thermopile. The at least one support beam has a first end portion coupled to the substrate and a second end portion coupled to the infrared radiation absorbing unit. The thermopile includes first and second electrical conductors disposed on the support beam with the first and second electrical conductors having different electric conductivities. The first and second electrical conductors is dimensioned and shaped to improve structural rigidity of the support beam in comparison to an identically shaped support beam including a thermopile with a pair of first and second electrical conductors that are identically shaped and disposed parallel to each other.

These and other objects, features, aspects and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring initially to FIGS. 1 to 6, an infrared radiation detecting device is illustrated in accordance with a first embodiment of the present invention.

Figure 1:
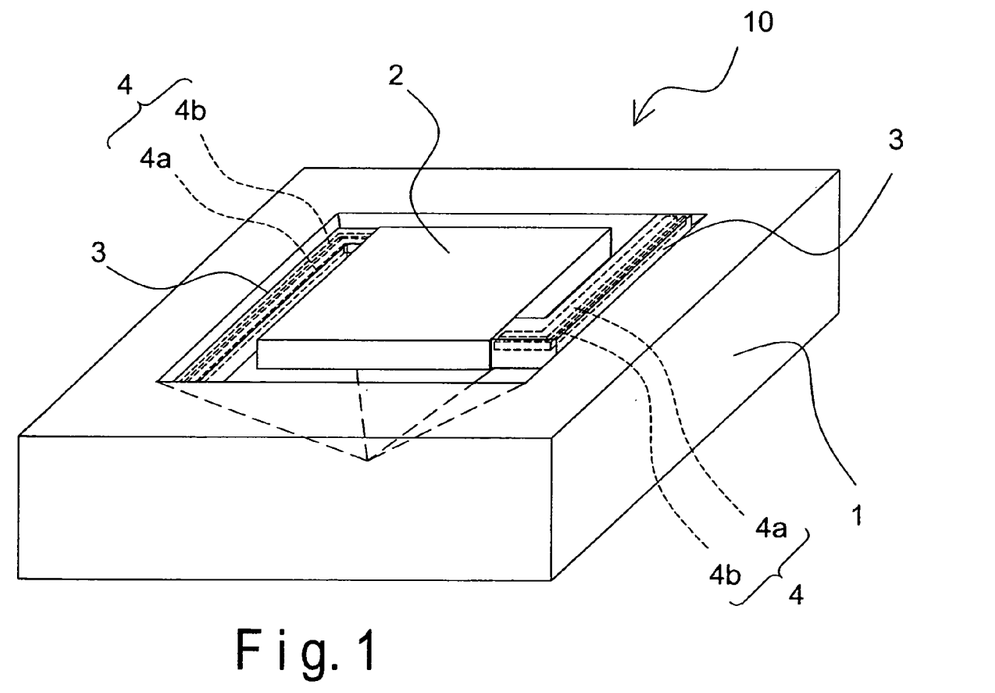
FIG. 1 is an overall perspective view of an infrared radiation detecting device in accordance with a first embodiment of the present invention.
Figure 2:
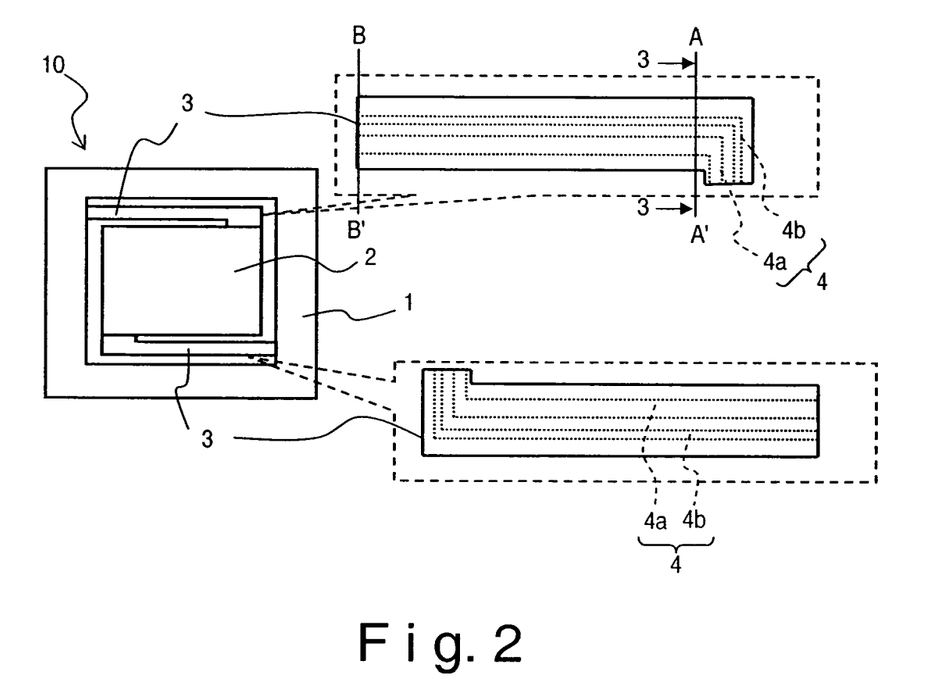
FIG. 2 is a simplified top plan view of the infrared radiation detecting device illustrating a pair of support beams and a thermopile in accordance with the first embodiment of the present invention.

FIG. 1 is an overall perspective view of the infrared radiation detecting device, while FIG. 2 is a simplified top plan view of the infrared radiation detecting device in accordance with the first embodiment of the present invention. As seen in FIGS. 1 and 2, the infrared radiation detecting device 10 basically comprises a substrate 1, an infrared radiation absorbing unit 2 (i.e., the infrared radiation detecting unit or light receiving unit), a pair of support beams 3, and a thermopile 4. The substrate 1 is preferably made of silicon or the like. The support beams 3 are configured and arranged to connect the infrared radiation absorbing unit 2 to the substrate 1. In the first embodiment of the present invention, the infrared radiation detecting device 10 is preferably provided with two L-shaped support beams 3 so that the centrally positioned infrared radiation absorbing unit 2 is supported over the substrate 1 by the two support beams 3 as seen in FIGS. 1 and 2.

The thermopile 4 preferably includes at least a pair of polysilicon resistance films (electrical conductors) made of a first conductive substance and a second conductive substance that has a smaller electric conductivity than the first conductive substance. More specifically, in the first embodiment of the present invention, the thermopile 4 preferably includes two pairs of a p-type polysilicon film 4a (second electrical conductor) made of a p-type polysilicon (second conductive substance) and an n-type polysilicon film 4b (first electrical conductor) made of an n-type polysilicon (first conductive substance). Each pair of the p-type polysilicon film 4a and the n-type polysilicon film 4b is disposed on each of the support beams 3 as best seen in FIG. 2.

Each of the support beams 3 is preferably configured and arranged to have a conventional structure except for the arrangement of the p-type polysilicon film 4a and the n-type polysilicon film 4b. More specifically, as seen in FIG. 3, each support beam 3 preferably includes a nitride film 31 for supporting the p-type polysilicon film 4a and the n-type polysilicon film 4b, an oxidized film 32 disposed between the p-type polysilicon film 4a and the n-type polysilicon film 4b, an oxidized film 33 disposed over the p-type polysilicon film 4a and the n-type polysilicon film 4b for insulating the p-type polysilicon film 4a and the n-type polysilicon film 4b, and a protection film 34 disposed on top of the oxidized film 33.

Figure 3:
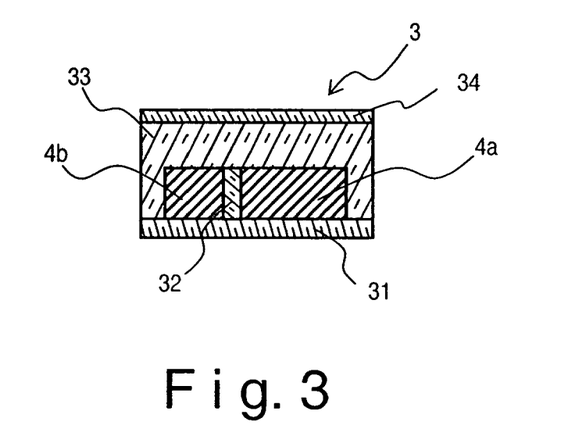
FIG. 3 is a simplified cross sectional view of the support beam taken along a section line 3—3 of FIG. 2 in accordance with the first embodiment of the present invention.

In the first embodiment of the present invention, the thermopile 4 is configured and arranged such that a cross sectional area of the p-type polysilicon film 4a is larger than a cross sectional area of the n-type polysilicon film 4b as seen in FIG. 3. More specifically, a width of the p-type polysilicon film 4a is larger than a width of the n-type polysilicon film 4b. Additionally, as seen in FIGS. 2 and 3, the p-type polysilicon film 4a is disposed on the support beam 3 in a position closer to a center portion of the infrared radiation detecting device 10 than the n-type polysilicon film 4b. In other words, the p-type polysilicon film 4a is disposed on the support beam 3 inwardly with respect to the n-type polysilicon film 4b, and the n-type polysilicon film 4b is disposed on the support beam 3 outwardly with respect to the p-type polysilicon film 4a.

The infrared radiation absorbing unit 2 and the substrate 1 are thermally isolated from each other by, for example, a square pyramid-shaped space (thermal isolation region) formed in the upper surface of the substrate 1 as seen in FIG. 1. More specifically, in order to improve the thermal insulation of the centrally positioned infrared radiation absorbing unit 2, a portion of the silicon substrate 1 located directly under the infrared radiation absorbing unit 2 is preferably removed using micromachining technology or the like. As a result, an empty space (the thermal isolation region) is formed in the upper surface of the silicon substrate 1 to separate the infrared radiation absorbing unit 2 from the silicon substrate 1.

As mentioned above, in the first embodiment, the infrared radiation absorbing unit 2 is preferably supported by the two support beams 3 on which two pairs of the p-type polysilicon film 4a and the n-type polysilicon film 4b are disposed, respectively. As shown in FIG. 2, the p-type polysilicon film 4a with a larger width (i.e., larger than the width of the n-type polysilicon film 4b) is arranged on an inside portion of each support beam 3 near the infrared radiation absorbing unit 2, and the n-type polysilicon film 4b with a narrower width (i.e., narrower than the width of the p-type polysilicon film 4a) is arranged on an outside portion of each support beam 3. These four polysilicon films 4a and 4b are connected together in series to form the thermopile 4 in the conventional manner.

As mentioned above, the electric conductivity of the p-type polysilicon is smaller than the electric conductivity of the n-type polysilicon. In other words, the carrier mobility of the n-type polysilicon is higher that that of the p-type polysilicon and the electric resistance of the n-type polysilicon is lower than that of the p-type polysilicon.

Figure 16A:
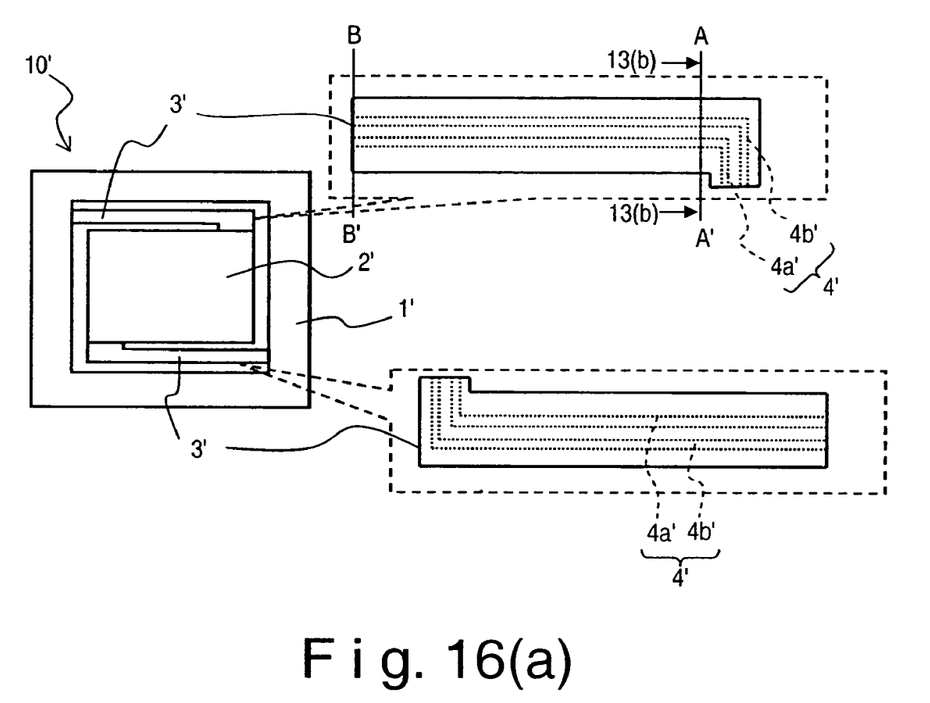
FIG. 16 is a series of schematic diagrams illustrating a comparison example of an infrared radiation detecting device in which a pair of electrical conductors with the same size is arranged parallel to each other on a support beam.
Figure 16B:
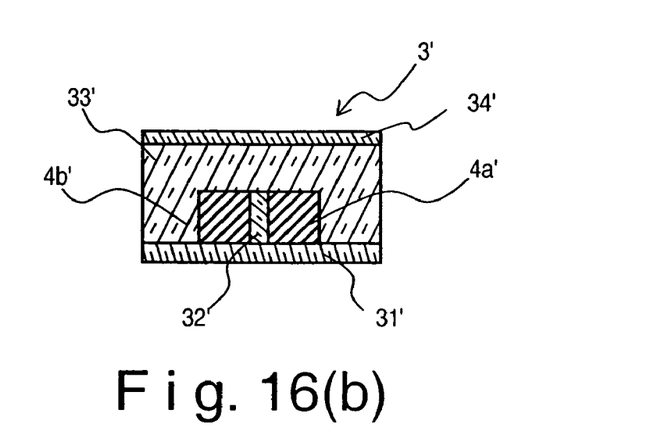

In order to better understand the present invention, a comparative example of a structure of an infrared radiation detecting device 10' in which the cross sectional areas of two polysilicon films 4a' and 4b' making up a thermopile 4' are the same are illustrated in FIGS. 16(a) to 16(g). As shown in FIGS. 16(a) and 16(b), when the cross sectional areas of the p-type polysilicon film 4a' and the n-type polysilicon film 4b' that make up the thermopile 4' are the same, the electric resistance of the p-type polysilicon film 4a' is high and the amount of thermal noise is large. On the other hand, in the first embodiment of the present invention, since the cross sectional area of the p-type polysilicon film 4a is larger than the cross sectional area of the n-type polysilicon film 4b, the electric resistance of the p-type polysilicon film 4a can be reduced and the thermal noise can be suppressed without changing the thermal resistance of the support beam 3.

Figure 4:
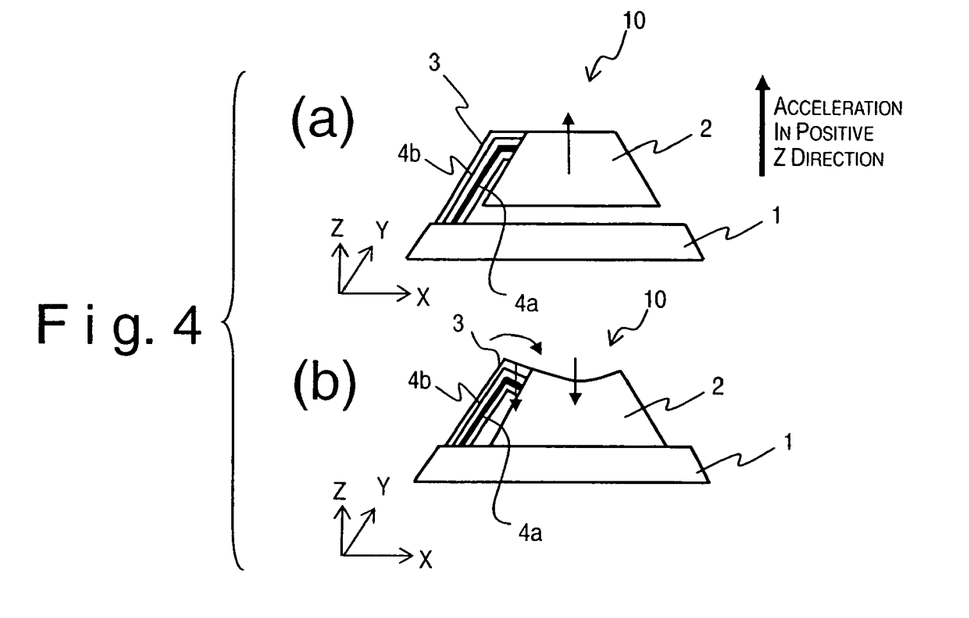
FIG. 4 is a series of schematic diagrams of the infrared radiation detecting device when an infrared radiation absorbing unit of the infrared radiation detecting device undergoes acceleration in accordance with the first embodiment of the present invention.
Figure 5:
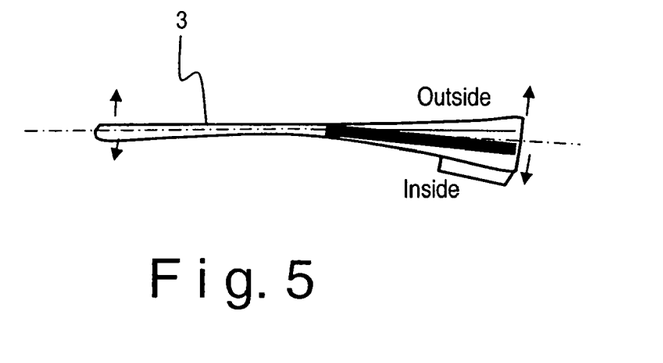
FIG. 5 is a schematic side view of the support beam illustrating the stresses applied to the support beam when the infrared radiation absorbing unit of the infrared radiation detecting device undergoes acceleration in accordance with the first embodiment of the present invention.
Figure 6:
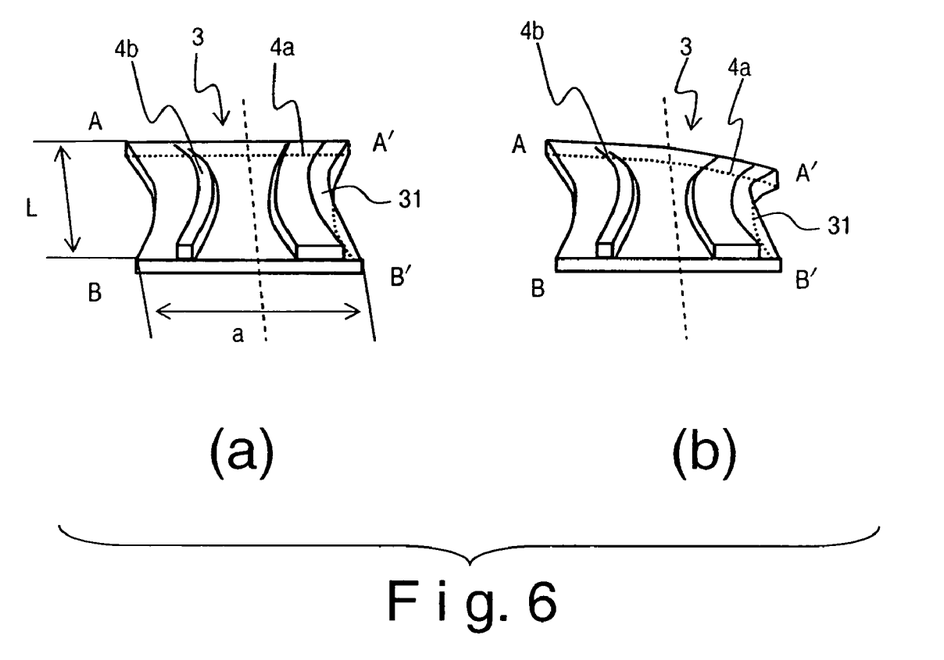
FIG. 6 is a series of schematic diagrams of the support beam and the thermopile of the infrared radiation detecting device illustrating operational effects when the infrared radiation absorbing unit of the infrared radiation detecting device undergoes acceleration in accordance with the first embodiment of the present invention.

Referring now to FIGS. 4 to 6, the operational effects of the infrared radiation detecting device 10 of the first embodiment when the infrared radiation absorbing unit 2 undergoes acceleration will be explained. Since the structures of both support beams 3 and the pairs of the polysilicon films 4a and 4b of the thermopile 4 are basically identical, only one side of the support beam 3 with one pair of the polysilicon films 4a and 4b is used herein to explain the operational effects of the infrared radiation detecting device 10 of the first embodiment. Moreover, only the nitride film 31 and the pair of the polysilicon films 4a and 4b of the support beam 3 are depicted in FIG. 6 for better explain the effects of the present invention and simplifying the illustration.

In the thermopile-type infrared radiation detecting device 10 having the infrared radiation absorbing unit 2 arranged in the central position and supported on at least one support beam 3' that is bent into the L shape, a force acts on the infrared radiation absorbing unit 2 when the infrared radiation absorbing unit 2 undergoes acceleration in a direction perpendicular to the surface thereof as seen in diagrams (a) and (b) of FIG. 4. More specifically, when the infrared radiation absorbing unit 2 accelerates in the positive Z direction as shown in the diagram (a) of FIG. 4, a force oriented in the negative Z direction (downward in the diagrams (a) and (b) of FIG. 4) acts on the membrane of the infrared radiation absorbing unit 2 due to inertia as seen in the diagram (b) of FIG. 4. Meanwhile, a bending stress oriented in the X direction and a torsional stress develop in the L-shaped support beam 3.

Figure 16C:
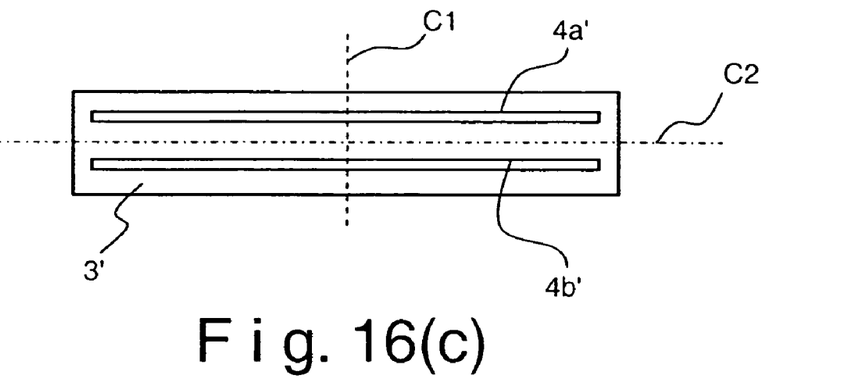
Figure 16D:
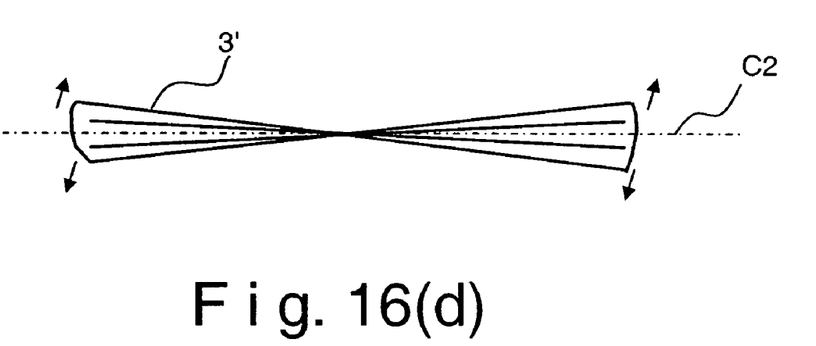

When the cross sectional areas of the p-type polysilicon film 4a' and the n-type polysilicon film 4b' are the same as in the comparison example of the infrared radiation detecting device shown in FIGS. 16(a) to 16(g), a bending vibration occurs which is centered on the dotted line C1 shown in FIG. 16(c). In such case, the polysilicon films 4a' and 4b' function as reinforcement members with respect to the resulting bending stress that is centered on the dotted line C1. Meanwhile, similarly to the bending stress, a stress in the torsional direction centered on the single-dot chain line C2 shown in FIG. 16(c) also develops in the support beam 3' as shown FIG. 16(d). However, the polysilicon films 4a' and 4b' do not function as reinforcement members with respect to the resulting bending stress centered on the single-dot chain line C2. Even though a plurality of pairs of the polysilicon films 4a' and 4b' are formed on the support beams 3, both bending stress and torsional stress occur as shown in the diagrams FIGS. 16(c) and 16(d) when the polysilicon films 4a' and 4b' with substantially same cross sectional areas are disposed parallel to each other. As explained above, the polysilicon films 4a' and 4b' of the thermopile 4' function as reinforcement members with respect to the bending stress but do not function very well as reinforcement members with respect to the torsional stress in the comparison example of the infrared radiation detecting device 10' shown in the diagrams of FIG. 16.

Figure 16E:
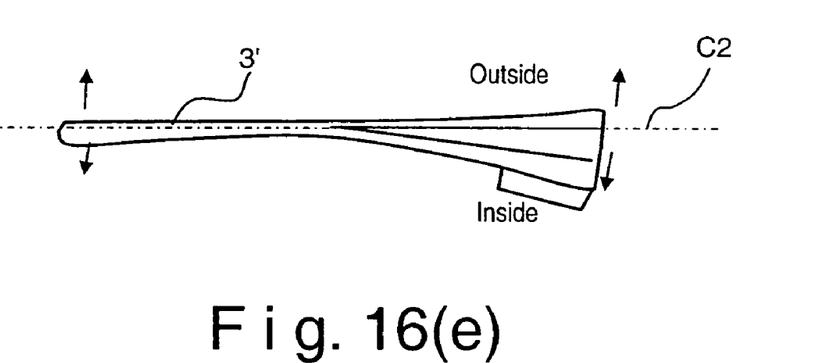
Figure 16F:
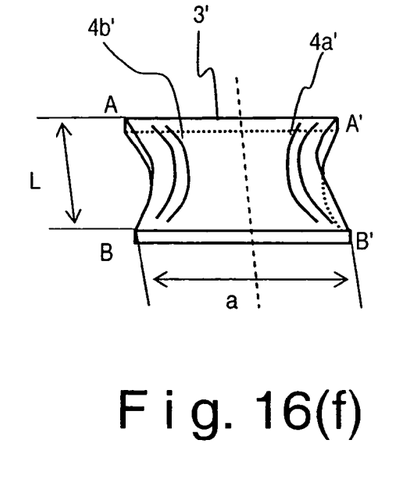
Figure 16G:
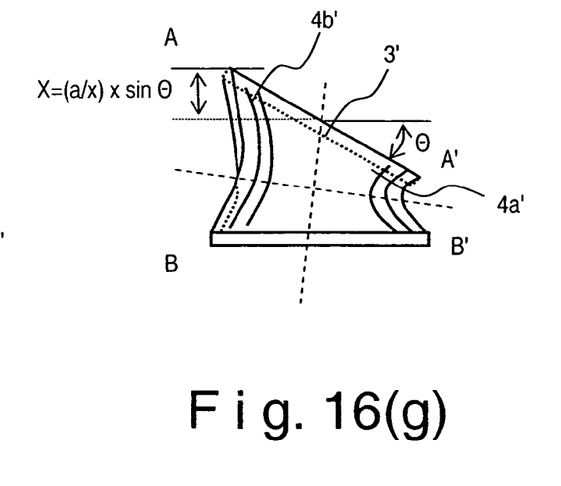

Moreover, when the cross sectional areas of the p-type polysilicon film 4a' and the n-type polysilicon film 4b' are the same as in the comparison example of the infrared radiation detecting device 10' shown in FIGS. 16(a) to 16(g), the stress is larger on the inward side of the support beam 3' located closer to the infrared radiation absorbing unit 2' than on the outer side as shown in FIG. 16(e). Furthermore, as shown in FIGS. 16(f) and 16(g), the support beam 3' undergoes a large deformation in the comparison example of the infrared radiation detecting device 10'. The support beam 3' undergoes a torsional vibration centered on the line C2 indicated with a single-dot chain line shown in the FIG. 16(c) and the general pattern of the vibration is as illustrated in FIG. 16(e). The stress applied on the support beam 3' is larger on the inner side where the infrared radiation absorbing unit 2' is connected.

In FIGS. 6 and 16(a) and 16(b), the end of the support beam 3 (or 3') indicated with A and A' corresponds to the contact or connecting point where the infrared radiation absorbing unit 2 (or 2') is coupled to the support beam 3 (or 3') and the end indicated with B and B' corresponds to the contact or connecting point where the support beam 3 (or 3') connects to the substrate 1. Also, in FIGS. 6 and 16(f) and 16(g), "L" indicates the length of the support beam 3 (or 3') and "a" indicates the width of the support beam 3 (or 3').

In the infrared radiation detecting device 10 having the L-shaped support beam 3, a torsional force acts on the support beam 3 due to the law of inertia when acceleration occurs in the direction of the Z-axis shown in the diagrams (a) and (b) of FIG. 4. In the infrared radiation detecting device 10 of the first embodiment, a large torsional force acts on a portion of the inner side of the support beam 3 near where the support beam 3 bends (i.e., near the corner of the L shape). Thus, larger stress is applied to the p-type polysilicon film 4a, which is located on the inner side of the support beam 3. With the first embodiment, the rigidity of the support beam 3 is increased because the width of the p-type polysilicon film 4a located on the inner side of the support beam 3 is larger than the width of the n-type polysilicon film 4b located on the outer side of the support beam 3, as shown in FIG. 6.

Moreover, with the infrared radiation detecting device 10 in accordance with the first embodiment of the present invention, the thermal noise of the infrared radiation detecting device 10 can be reduced.

In general, the sensitivity R of a thermopile-type infrared radiation detecting device is expressed as shown in the equation below, where n is the number of thermocouples, α is the Seebeck coefficient, Rth is the combined thermal resistance of the support beams 3, and h is the infrared radiation absorptance.

$$R = n \times \alpha \times Rth \times h \quad \text{(Equation 1)}$$

The thermal noise Vn resulting from the electric resistance of the thermopile is given by the equation below, where k is the Boltzmann's constant, T is the absolute temperature, R is the electric resistance of the thermopile, and Δf is the frequency band width.

$$Vn = (4 \times k \times T \times R \times \Delta f)1/2 \quad \text{(Equation 2)}$$

As can be understood based on Equation 1, the sensitivity R does not change if the combined thermal resistance Rth of the support beams 3 does not change. In other words, if the width of the n-type polysilicon film 4b is decreased by an amount corresponding to the increase in the width of the p-type polysilicon film 4a, the same sensitivity R can be maintained. Meanwhile, since the p-type polysilicon uses electron holes as the carrier, the carrier mobility of the p-type polysilicon film 4a is small and the electric conductivity of the p-type polysilicon film 4a is low, i.e., the electric resistance of the p-type polysilicon is high. Conversely, since the n-type polysilicon uses electrons as the carrier, the carrier mobility of the n-type polysilicon film 4b is large and the electric conductivity of the n-type polysilicon film 4b is high, i.e., the electric resistance of the n-type polysilicon film 4b is low. The electric resistance of the n-type polysilicon is approximately ⅓ to ⅕ that of the p-type polysilicon. Thus, based on Equation 2 above, the thermal noise Vn generated by the p-type polysilicon is larger than the thermal noise Vn generated by the n-type polysilicon when the cross sectional areas (i.e., widths in this embodiment) of the two films are the same. Thus, by increasing the width of the p-type polysilicon film 4a, the electric resistance can be reduced and, therefore, the thermal noise Vn of the thermopile 4 as a whole can be reduced.

Accordingly, based on the preceding explanations regarding structural rigidity and reduction of thermal noise, the rigidity of the support beams 3 can be increased and the thermal noise of the infrared radiation detecting device 10 can be reduced simultaneously by arranging the p-type polysilicon film 4a on the inner side of the support beams 3 and making its width larger than that of the n-type polysilicon film 4b.

As explained above, in the infrared radiation detecting device of the first embodiment, the polysilicon film 4a of the thermopile 4, which is made of the conductive substance having the smaller electric conductivity (i.e., the p-type polysilicon in the first embodiment), is arranged to have a larger cross sectional area and arranged in an inward position near the center portion of the infrared radiation detecting device 10, and the polysilicon film 4b of the thermopile 4, which is made of the conductive substance having the larger electric conductivity (i.e., the n-type polysilicon in the first embodiment) is arranged to the outside of the p-type polysilicon film 4a. Therefore, the electric resistance can be reduced without changing the thermal resistance of the support beams 3. Moreover, by arranging the p-type polysilicon film 4a with the larger cross sectional area in an inward position than the n-type polysilicon film 4b with the smaller cross sectional area, the torsional rigidity of the support beam 3 is increased, the resonance frequency of the thermal isolation structure as a whole is increased, and the possibility of the infrared radiation detecting device 10 being broken due to vibrations (e.g., when the infrared radiation detecting device 10 is installed in a vehicle) is reduced.

Accordingly, the infrared radiation detecting device 10 of the first embodiment makes it possible to reduce thermal noise and improve structural rigidity of the support beams 3.

Second Embodiment

Referring now to FIGS. 7–10, modifications to the infrared radiation detecting device 10 will now be explained in accordance with a second embodiment. In particular, a pair of modified infrared radiation detecting devices 110 and 110' will now be explained in which the cross-sectional dimensions of the polysilicon films have been modified. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

Figure 7:
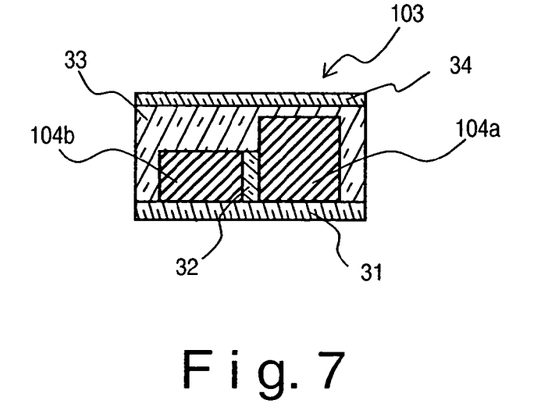
FIG. 7 is a simplified cross sectional view of a support beam, similar to FIG. 2, in accordance with a second embodiment of the present invention.
Figure 8:
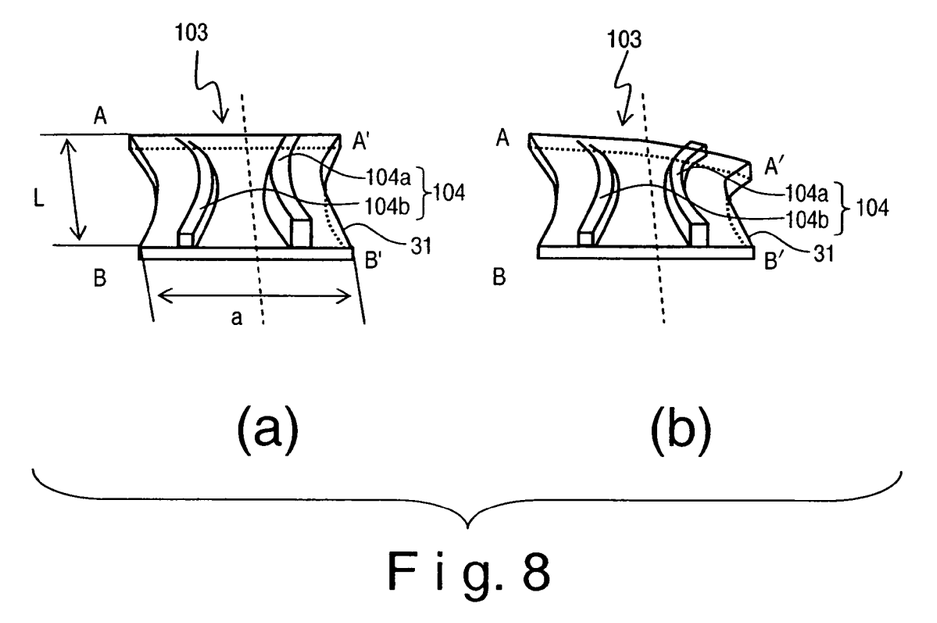
FIG. 8 is a series of schematic diagrams of a support beam with a thermopile of an infrared radiation detecting device illustrating operational effects when an infrared radiation absorbing unit of the infrared radiation detecting device undergoes acceleration in accordance with the second embodiment of the present invention.

The infrared radiation detecting device 110 of the second embodiment is basically identical to the infrared radiation detecting device 10 of the first embodiment, except that in the second embodiment the cross sectional area of a p-type polysilicon film 104a of a thermopile 104 is increased by increasing a film thickness or height instead of the film width as in the first embodiment. In other words, the thermopile 104 is arranged such that the height of the p-type polysilicon film 104a as measured from a nitride film 31 of the support beam 103 is larger than the height of the n-type polysilicon film 104b. Although the manufacturing process of the infrared radiation detecting device 110 of the second embodiment is somewhat more complex, the second embodiment can be achieved without changing the pattern layout of the support beams 103 and the thermopile 104 at all. Therefore, the infrared radiation detecting device 110 of the second embodiment is useful in situations where the widths of the support beams 103 are small and it is difficult to increase the width of the p-type polysilicon film 104a as in the first embodiment.

Figure 9:
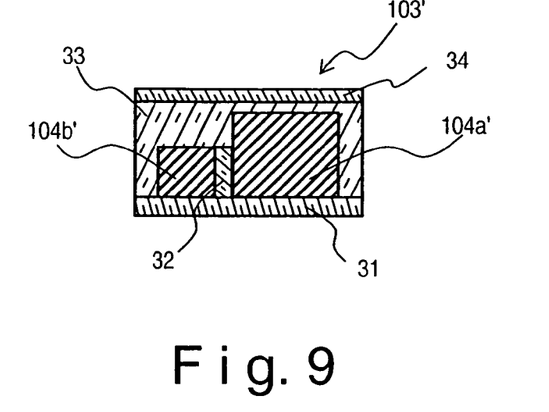
FIG. 9 is a simplified cross sectional view of a support beam, similar to FIGS. 2 and 7, in accordance with a third embodiment of the present invention.
Figure 10:
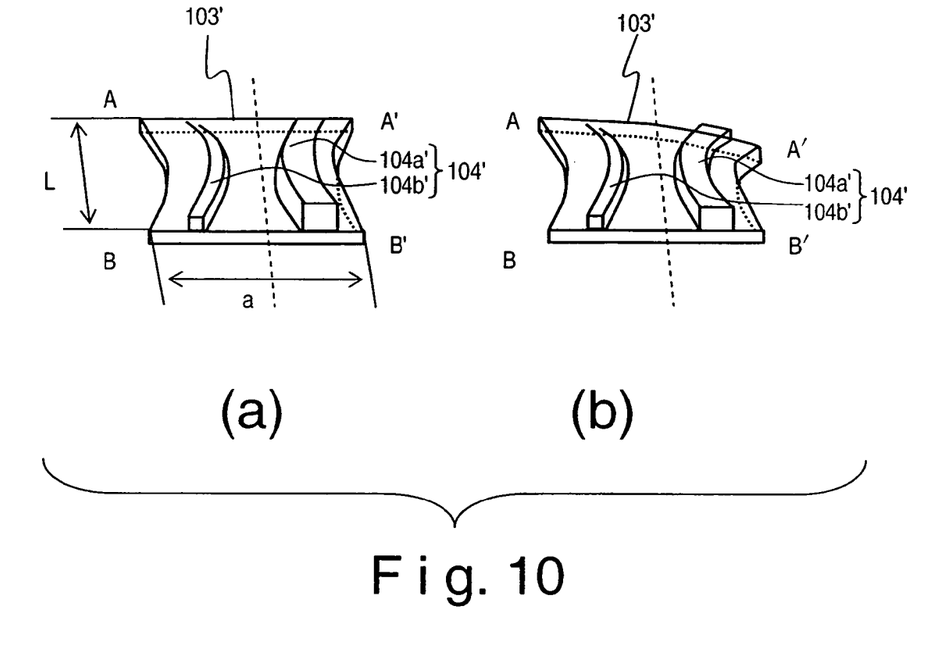
FIG. 10 is a series of schematic diagrams of a support beam with a thermopile of an infrared radiation detecting device illustrating operational effects when an infrared radiation absorbing unit of the infrared radiation detecting device undergoes acceleration in accordance with a modified structure of the second embodiment of the present invention.

Of course, it will be apparent to those skilled in the art from this disclosure that a thermopile 104' can be arranged such that both the width and the height of a p-type polysilicon film 104a' are larger than the width and height of an n-type polysilicon film 104b' as seen in FIGS. 9 and 10. In other words, this modified infrared radiation detecting device 110' of the modified second embodiment is basically identical to the infrared radiation detecting device 10 of the first embodiment, except that in the second embodiment the cross sectional area of a p-type polysilicon film 104a of a thermopile 104 is increased by increasing a film thickness or height as well as the film width as in the first embodiment.

Third Embodiment

Figure 11:
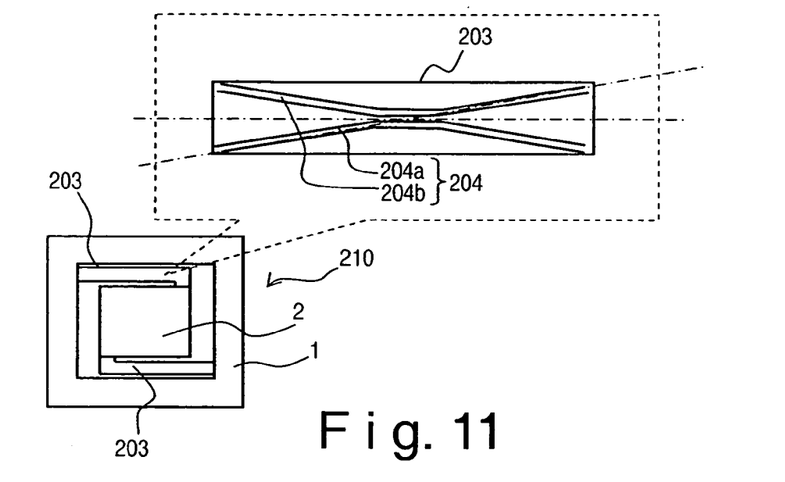
FIG. 11 is a simplified top plan view of the infrared radiation detecting device illustrating a pair of support beams and a thermopile in accordance with a third embodiment of the present invention.
Figure 12:
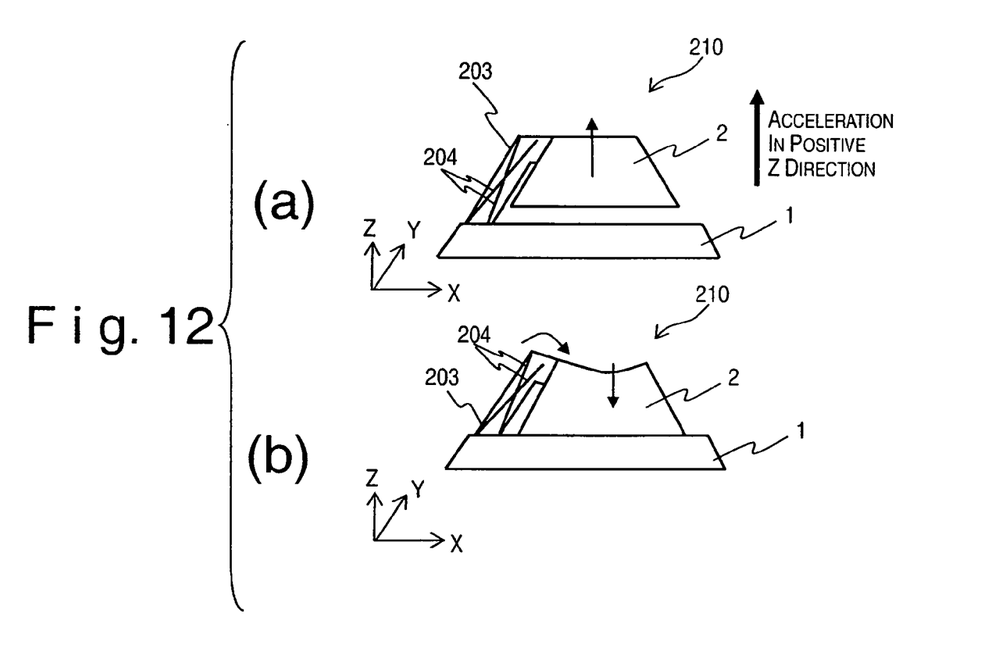
FIG. 12 is a series of schematic diagrams of the infrared radiation detecting device when an infrared radiation absorbing unit of the infrared radiation detecting device undergoes acceleration in accordance with the third embodiment of the present invention.
Figure 13:
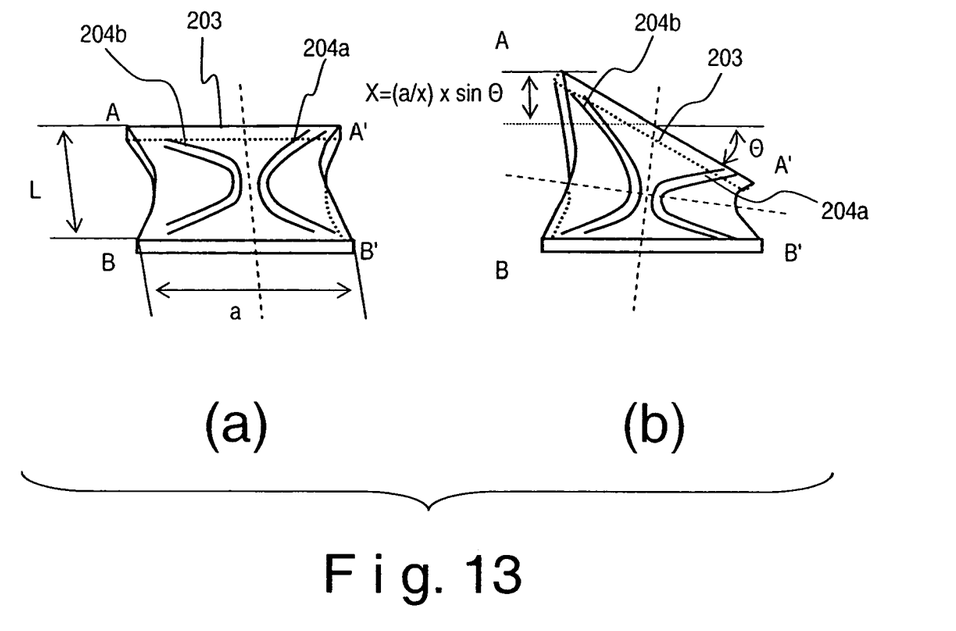
FIG. 13 is a series of schematic diagrams of the support beam and the thermopile of the infrared radiation detecting device illustrating operational effects when the infrared radiation absorbing unit of the infrared radiation detecting device undergoes acceleration in accordance with the third embodiment of the present invention.

Referring now to FIGS. 11 to 13, an infrared radiation detecting device 210 in accordance with a third embodiment will now be explained. In view of the similarity between the first and third embodiments, the parts of the third embodiment that are identical to the parts of the first embodiment will be given the same reference numerals as the parts of the first embodiment. Moreover, the descriptions of the parts of the third embodiment that are identical to the parts of the first embodiment may be omitted for the sake of brevity.

The infrared radiation detecting device 210 of the third embodiment of the present invention is basically identical to the infrared radiation detecting device 10 of the first embodiment, except for a structure of a pair of polysilicon films 204a and 204b of a thermopile 204 disposed on each of the support beams 203. The cross-sectional dimensions of the polysilicon films 204a and 204b of the thermopile 204 disposed on each of the support beams 203 can have different widths and/or different heights as in the prior embodiments, or identical, uniform cross-sectional dimensions as shown.

As shown in FIG. 11, that the p-type polysilicon film 204a and the n-type polysilicon film 204b of the infrared radiation detecting device 210 of the third embodiment are disposed on each of the support beams 203 so that a lateral spacing between the polysilicon films 204a and 204b varies through a longitudinal length of the support beam 203. More specifically, in the third embodiment, the lateral spacing between the polysilicon films 204a and 204b is narrow at the center portion of the support beam 203 and widens as moving toward the longitudinal ends of the support beam 203 as seen in FIG. 11. In other words, the polysilicon films 204a and 204b are disposed to form a generally X-shape outline when viewed from the top. FIG. 11 schematically depicts the shapes of the polysilicon films 204a and 204b in only one of the support beams 203 for the purpose of illustration. It will be apparent to those skilled in the art from this disclosure that the other one of the support beams 203 also has the same structure of the polysilicon films 204a and 204b as the one shown in FIG. 11. Moreover, it will be apparent to those skilled in the art from this disclosure that the support beams 203 are provided with the nitride film, the oxidized films, and the protection film as well as the polysilicon films 204a and 204b as explained in the first embodiment.

Thus, in the third embodiment of the present invention, the torsional stress in the support beam 203 is transferred to the polysilicon films 204a and 204b of the thermopile 204 as bending stress, as shown in FIGS. 12 and 13. Thus, the support beam 203 has more resistance to deformation comparing to the comparison example shown in FIG. 16 in which only the torsional stress is applied to the polysilicon films 4a' and 4b'. FIGS. 12 and 13 are schematic diagrams for illustrating the operational effects of the infrared radiation detecting device of the third embodiment.

In the diagrams (a) and (b) of FIG. 13, similar to the first embodiment, the end of the support beam 203 indicated with A and A' corresponds to the contact or connecting point where the infrared radiation absorbing unit 2 connects to the support beam 203, the end of the support beam 203 indicated with B and B' corresponds to the contact or connecting point where the support beam 203 connects to the substrate 1, and the length L indicates the length of the support beam 203, the width "a" indicates the width of the support beam 203.

Referring again to FIGS. 16(f) and 16(g) illustrating the comparison example of the infrared radiation detecting device 10', assume that the A-A' end of the support beam 3' is rotated by an angle $\theta$ about the lengthwise center axis of the support beam 3'. The point A' will be displaced upward by an amount $X=a/2 \times \sin \theta$ and the intermediate point c' will be displaced upward by an amount $X'=a/4 \times \sin \theta$. Therefore, in a situation where the polysilicon films 4a' and 4b' of the thermopile 4' are parallel to each other as illustrated in FIGS. 16(a) to 16(g), a displacement of X–X' will occur with respect to one-half the length of the support beam 3', i.e., with respect to L/2.

Meanwhile, in a situation where the lateral spacing between the polysilicon films 204a and 204b is narrower at the center portion of the support beam 203 as shown in FIG. 11, a displacement of X (which is larger than X–X') will occur with respect to the length L/2 in the thermopile 204 (because D does not undergo displacement). Conversely, if the same torsional stress is assumed to develop in the support beam 203, the displacement will be smaller in the case shown in the diagram (b) of FIG. 13 (the third embodiment of the present invention) than in the case shown FIG. 16(g) (comparison example). Thus, the polysilicon films 204a and 204b function as reinforcement members of the support beam 203 against the bending stress centered on the single-dot chain line shown in FIG. 11. In other words, the rigidity of the support beam 203 is improved with the third embodiment of the present invention. For reasons described above, the rigidity of the entire support beams 203, including the infrared radiation absorbing unit 2, is increased and, thus, the resonance frequency is also increased. As a result, the chances that an infrared radiation detecting device 210 in accordance with the third embodiment will break when installed on a vibrating object, e.g., a vehicle, can be reduced.

Accordingly, similarly to the first embodiment explained above, the third embodiment of the present invention enables to provide an infrared radiation detecting device having greater mechanical strength.

Fourth Embodiment

Figure 14:
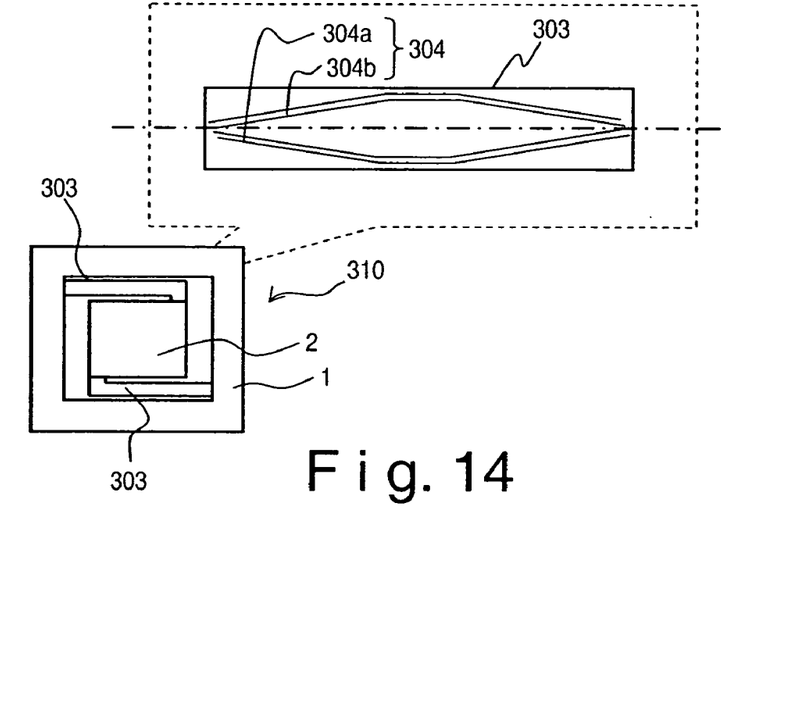
FIG. 14 is a simplified top plan view of a support beam and a thermopile of an infrared radiation detecting device in accordance with a fourth embodiment of the present invention.

Referring now to FIG. 14, an infrared radiation detecting device 310 in accordance with a fourth embodiment will now be explained. In view of the similarity between the third and fourth embodiments, the parts of the fourth embodiment that are identical to the parts of the third embodiment will be given the same reference numerals as the parts of the third embodiment. Moreover, the descriptions of the parts of the fourth embodiment that are identical to the parts of the third embodiment may be omitted for the sake of brevity.

The infrared radiation detecting device 310 of the fourth embodiment is basically identical to the infrared radiation detecting device 210 of the third embodiment, except for an arrangement of a pair of a p-type polysilicon film 304a and an n-type polysilicon film 304b of a thermopile 304 disposed on each of the support beams 303. The cross-sectional dimensions of the polysilicon films 304a and 304b of the thermopile 304 disposed on each of the support beams 303 can have different widths and/or different heights as in the prior embodiments, or identical, uniform cross-sectional dimensions as shown.

As seen in FIG. 14, which is a simplified top plan view of the support beam 303 with the polysilicon films 304a and 304b, in the fourth embodiment, the thermopile 304 is arranged such that the lateral spacing between the p-type polysilicon film 304a and the n-type polysilicon film 304b is wider at the center portion of the support beam 303 than at the longitudinal ends of the support beam 303.

This configuration provides basically the same effects as that are obtained with the third embodiment. In other words, by making the lateral spacing between the p-type polysilicon film 304a and the n-type polysilicon film 304b narrower at the ends of the support beam and wider at the middle, the torsional rigidity of the support beam 303 is increased and the resonance frequency of the thermal isolation structure of the infrared radiation detecting device 310 as a whole is increased. Accordingly, the chances of breakage of the infrared radiation detecting device due to the vibrations are decreased.

Fifth Embodiment

Figure 15:
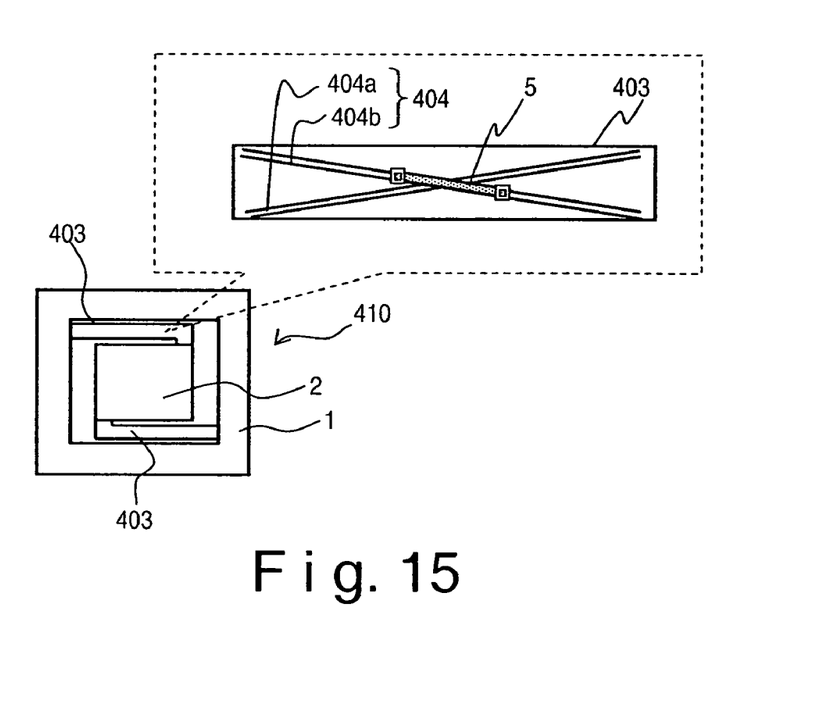
FIG. 15 is a simplified top plan view of a support beam and a thermopile of an infrared radiation detecting device in accordance with a fifth embodiment of the present invention.

Referring now to FIG. 15, an infrared radiation detecting device 410 in accordance with a fifth embodiment will now be explained. In view of the similarity between the third and fifth embodiments, the parts of the fifth embodiment that are identical to the parts of the third embodiment will be given the same reference numerals as the parts of the third embodiment. Moreover, the descriptions of the parts of the fifth embodiment that are identical to the parts of the third embodiment may be omitted for the sake of brevity.

The infrared radiation detecting device 410 of the fifth embodiment is basically identical to the infrared radiation detecting device 210 of the third embodiment, except for the arrangement of a pair of a p-type polysilicon film 404a and an n-type polysilicon film 404b of a thermopile 404 disposed on each of the support beams 403. The cross-sectional dimensions of the polysilicon films 404a and 404b of the thermopile 404 disposed on each of the support beams 403 can have different widths and/or different heights as in the prior embodiments, or identical, uniform cross-sectional dimensions as shown.

As seen in FIG. 15, in the fifth embodiment, the p-type polysilicon film 404a and the n-type polysilicon film 404b provided on the support beam 403 are arranged to partially overlap at the center portion of the support beam 403 in the top plan view. Furthermore, one of the p-type polysilicon film 404a and the n-type polysilicon film 404b is preferably divided in two parts that are connected by a metal wire, e.g., an aluminum wire 5 to form a grade separation between the p-type polysilicon film 404a and the n-type polysilicon film 404b.

With the fifth embodiment of the present invention, the p-type polysilicon film 404a and the n-type polysilicon film 404b can be formed in the same process using the same layer in the conventional processing method. Afterwards, an insulation layer is formed and the aluminum wire 5 is formed. In this way, the aluminum wire 5 enables the one of the polysilicon films 404a and 404b to pass over the other one of the polysilicon films 404a and 404b at the center portion of the support beam 403 without actually contacting it.

With the fifth embodiment, at least one of the p-type polysilicon film 404a and n-type polysilicon film 404b can be formed to run along a diagonal of the support beam 403 and intersect with another one of the p-type polysilicon film 404a and the n-type polysilicon film 404b. As a result, the rigidity of the support beam 403 can be increased even more than in the above explained embodiments.

Although the embodiments explained above present examples in which a pair of a p-type polysilicon film and an n-type polysilicon film is arranged on each of the support beams, it is also possible to have a larger number of polysilicon films on each of the support beams.

As used herein to describe the above embodiment(s), the terms that are expressed as "means-plus function" in the claims should include any structure that can be utilized to carry out the function of that part of the present invention. The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. An infrared radiation detecting device comprising:
   a substrate;
   an infrared radiation absorbing unit;
   at least one support beam with a first end portion coupled to the substrate and a second end portion coupled to the infrared radiation absorbing unit; and
   a thermopile including first and second electrical conductors disposed on the support beam with the first and second electrical conductors having different electric conductivities,
   the first and second electrical conductors being dimensioned and shaped to improve structural rigidity of the support beam in comparison to an identically shaped support beam including a thermopile with a pair of first and second electrical conductors that are identically shaped and disposed parallel to each other.

2. The infrared radiation detecting device as recited in claim 1, wherein
   the second electrical conductor has a cross sectional area that is larger than a cross sectional area of the first electrical conductor.

3. The infrared radiation detecting device recited in claim 2, wherein
   the second electrical conductor is disposed closer to the infrared radiation absorbing unit with respect to the first electrical conductor.

4. The infrared radiation detecting device recited in claim 3, wherein
   the second electrical conductor has a larger width than the first electrical conductor.

5. The infrared radiation detecting device recited in claim 4, wherein
   the first electrical conductor is made of n-type polysilicon and the second electrical conductor is made of p-type polysilicon.

6. The infrared radiation detecting device recited in claim 3, wherein
the second electrical conductor has a larger height than the first electrical conductor.

7. The infrared radiation detecting device recited in claim 6, wherein
the first electrical conductor is made of n-type polysilicon and the second electrical conductor is made of p-type polysilicon.

8. The infrared radiation detecting device recited in claim 2, wherein
the first electrical conductor is made of n-type polysilicon and the second electrical conductor is made of p-type polysilicon.

9. The infrared radiation detecting device recited in claim 2, wherein
the second electrical conductor has a larger width than the first electrical conductor.

10. The infrared radiation detecting device recited in claim 2, wherein
the second electrical conductor has a larger height than the first electrical conductor.

11. The infrared radiation detecting device as recited in claim 1, wherein
the first and second electrical conductors are disposed on the support beam such that a lateral spacing between the first and second electrical conductors varies through a longitudinal length of the support beam.

12. The infrared radiation detecting device recited in claim 11, wherein
the lateral spacing between the first and second electrical conductors is narrower at a center portion of the support beam than the lateral spacing between the first and second electrical conductors at the first and second end portions of the support beam.

13. The infrared radiation detecting device recited in claim 11, wherein
the first and second electrical conductors are disposed such that the first and second electrical conductors partially overlap each other at a center portion of the support beam in a top plan view.

14. The infrared radiation detecting device recited in claim 11, wherein
the first electrical conductor includes a first portion and a second portion that is connected with a wire portion at a position where the first electrical conductor overlaps with the second electrical conductor in the top plan view.

15. The infrared radiation detecting device recited in claim 11, wherein
the lateral spacing between the first and second electrical conductors is wider at a center portion of the support beam than the lateral spacing between the first and second electrical conductors at the first and second end portions of the support beam.

16. The infrared radiation detecting device recited in claim 1, wherein
the support beam is arranged as a substantially L-shape member.

17. The infrared radiation detecting device recited in claim 1, further comprising
an additional support beam with a first end portion coupled to the substrate and a second end portion coupled to the infrared radiation absorbing unit so that the infrared radiation absorbing unit is thermally isolated from the substrate while the infrared radiation absorbing unit is supported by both of the support beam and the additional support beam.

18. The infrared radiation detecting device recited in claim 17, wherein
both of the support beam and the additional support beam are identical in construction except for orientation relative to the substrate.

19. An infrared radiation detecting device, comprising:
substrate means for forming a base;
infrared radiation absorbing means for absorbing an infrared radiation;
support means for supporting the infrared radiation absorbing means over the substrate means while the infrared radiation absorbing means being thermally isolated from the substrate means; and
temperature detecting means for detecting change in a temperature of the infrared radiation absorbing means and for reinforcing a structural rigidity of the support means against at least torsional stress due to a force applied on the infrared radiation absorbing means.

* * * * *